United States Patent [19]

Rice et al.

[11] Patent Number: 4,510,465
[45] Date of Patent: Apr. 9, 1985

[54] LINEAR GAIN VOLTAGE CONTROLLED OSCILLATOR WITH MODULATION COMPENSATION

[75] Inventors: Craig W. Rice, Ft. Lauderdale; Marc H. Popek, Tamarac, both of Fla.

[73] Assignee: Motorola, Inc., Schaumburg, Ill.

[21] Appl. No.: 522,623

[22] Filed: Aug. 12, 1983

[51] Int. Cl.³ .................... H03C 3/08; H03C 3/09
[52] U.S. Cl. .................... 332/16 T; 331/23; 331/36 C; 331/117 FE; 331/177 V; 332/18; 332/19; 332/30 V
[58] Field of Search .......... 331/36 C, 117 R, 117 FE, 331/177 V, 15, 183, 23; 332/16 T, 18, 19, 30 V

[56] References Cited

U.S. PATENT DOCUMENTS

| | | | |
|---|---|---|---|
| 3,534,295 | 10/1970 | Gregory | 332/30 V |
| 3,579,281 | 5/1971 | Kam et al. | 332/30 V |
| 3,593,204 | 7/1971 | Healey | 332/30 V |
| 3,617,947 | 11/1971 | Jensen et al. | 332/18 |
| 4,003,004 | 1/1977 | Fletcher et al. | 332/30 V |
| 4,074,209 | 2/1978 | Lysobey | 332/19 |
| 4,117,422 | 9/1978 | Hunt | 332/19 |
| 4,134,085 | 1/1979 | Driscoll et al. | 332/16 T |
| 4,242,649 | 12/1980 | Washburn, Jr. | 332/18 |
| 4,375,621 | 3/1983 | Schneiter et al. | 332/16 T |
| 4,378,534 | 3/1983 | Goedken et al. | 332/30 V |

FOREIGN PATENT DOCUMENTS 2706662 8/1978 Fed. Rep. of Germany ... 332/30 V

OTHER PUBLICATIONS

IBM Technical Disclosure Bulletin, "FM Angle Modulator with Frequency Compensated Deviation", by D. R. Irvin, vol. 21, No. 6, Nov. 1978, pp. 2482-2483.

Primary Examiner—Siegfried H. Grimm
Attorney, Agent, or Firm—Joseph T. Downey; Edward M. Roney; James W. Gillman

[57] ABSTRACT

In a compensated VCO circuit arrangement for providing constant modulation level over a wide frequency band a VCO is disclosed having a linear VCO gain factor vs. control voltage curve over the wide frequency band of interest. A compensation network is coupled to the VCO to provide an audio output having a linear output level vs. control voltage curve. By appropriately matching the two linear curves the variation in modulation level over the frequency band of interest is substantially reduced.

9 Claims, 6 Drawing Figures

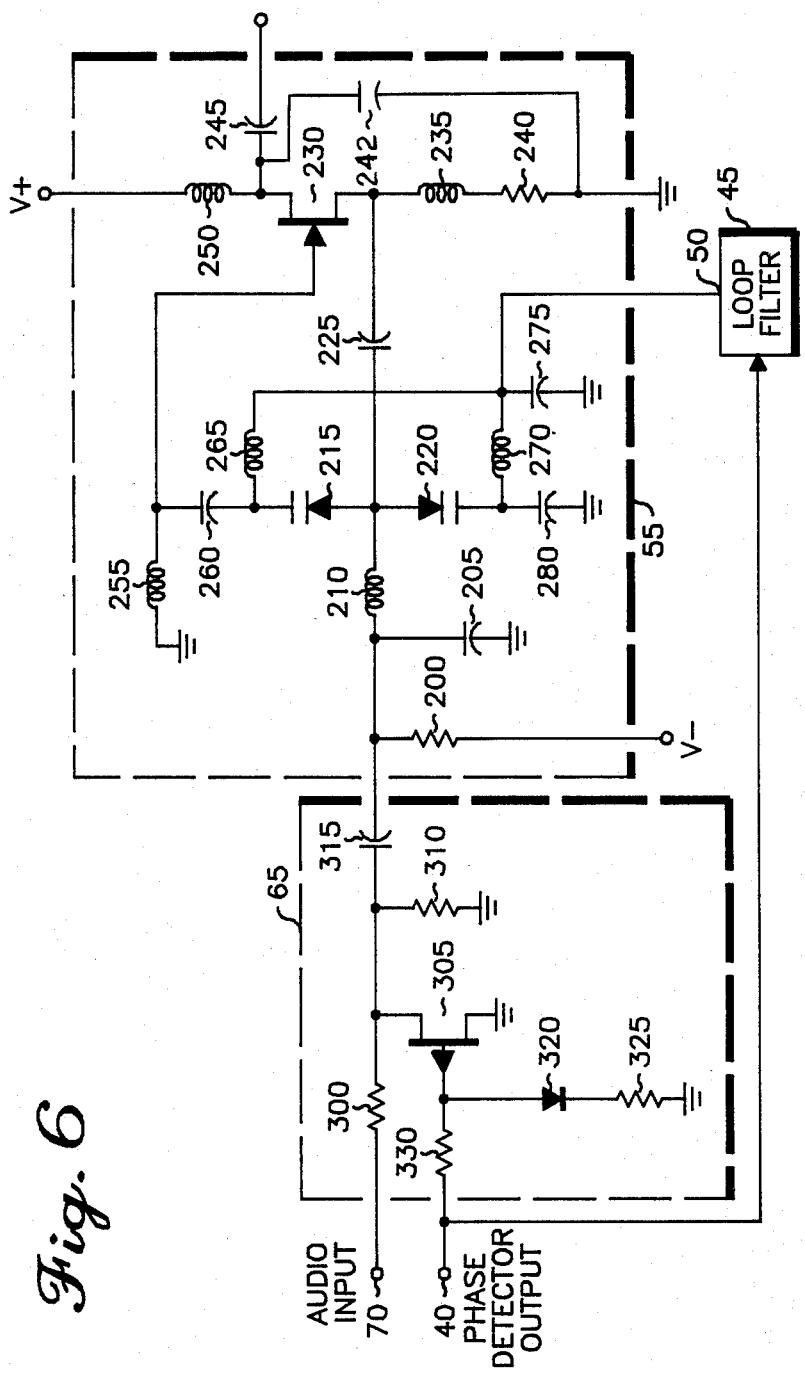

LINEAR GAIN VOLTAGE CONTROLLED OSCILLATOR WITH MODULATION COMPENSATION

BACKGROUND OF THE INVENTION

1. Field of the Invention

This invention relates generally to the field of phase locked loop frequency synthesizers. More particularly, this invention relates to wide band phase-locked loop frequency synthesizers for angular modulation systems requiring constant modulation levels over the entire radio frequency band of operation of the synthesizer.

2. Background of the Invention

It is desirable and sometimes necessary due to government regulations to produce a constant level of maximum modulation from a transmitter at each frequency at which the transmitter is operated. This requirement creates a particularly difficult problem to overcome in the field of wide-band frequency synthesized transmitters.

Conventional voltage controlled oscillators, which are used in the phase locked loop frequency synthesizers for such broadband transmitters, typically utilize voltage variable capacitor elements known as varactor diodes. These varactor diodes can resonate with an inductive element such that as the voltage applied to a varactor diode varies, the capacitance changes resulting in a shift in the resonant frequency of the oscillator. The output frequency versus control voltage characteristics of such an oscillator is shown in a broken line as curve 10 of FIG. 1. The VCO gain factor $K_0$ (expressed in MHz/volt) exhibits a similar non-linear shape as shown in FIG. 2 as curve 15, also shown in a broken line.

In a frequency modulation system, the control voltage of the VCO is typically modulated with audio frequency voltages to produce a resultant FM deviation. If the conventional voltage controlled oscillator is operated over a wide frequency band the non-linearities of FIGS. 1 and 2 manifest themselves as a variation in FM deviation across the frequency band.

Referring to FIG. 3, this variation in FM deviation or non-linearity is seen in curve 20 shown in a broken line. For a constant magnitude audio input, modulation is directly proportioned to $K_0$ so that at lower frequencies where a low level of control voltage is utilized, resultant modulation may be quite high, while at higher frequencies where the control voltage must be at a higher level the resultant modulation falls off substantially. Such wide variations and resultant modulations can produce undermodulation at higher frequencies, overmodulation at lower frequencies and thereby produce a failure to meet government regulations.

Various compensation techniques have been utilized to effect a flattening of the resultant modulation vs. control voltage curve such as shown in FIG. 3 as solid line curve 120 so that for example, FM deviation remains constant over the entire synthesizer frequency range. One such technique utilizes the forward bias characteristics of a junction diode in an attempt to counteract the non-linearities of curve 20. Since these non-linearities are not a perfect match, the compensation is only good for a narrow range of frequencies compared with the present invention.

Other techniques have involved attempting to linearize and flatten the characteristics of the varactor diode itself in order to obtain flat modulation over a particular frequency range. These attempts generally result in highly complex and expensive circuit arrangements.

Such techniques have met with limited success while requiring a large number of circuit elements. These techniques have provided an acceptable response over a frequency range perhaps as great as several megahertz with acceptable temperature performance and frequency stability. However, for wideband synthesizers requiring linear modulation over a frequency range having a magnitude of 10 to 20% of the RF center frequency, these compensation techniques are grossly inadequate.

SUMMARY OF THE INVENTION

It is an object of the present invention to provide an improved voltage controlled oscillator having linear VCO gain factor vs. control voltage characteristics over a wide frequency range.

It is another object of the present invention to provide a compensation network having output signal level vs. control voltage characteristics which are linear and complementary to the characteristics of a linear gain voltage controlled oscillator.

It is another object of the present invention to provide an improved compensated voltage controlled oscillator arrangement to produce substantially constant modulation levels over a wide frequency range of operation.

It is a further object of the present invention to provide a compensated voltage controlled oscillator arrangement suitable for use with wide band FM synthesized transmitters.

These and other objects of the invention will become apparent to those skilled in the art upon consideration of the following description of the invention.

According to one embodiment of the present invention, a linear gain compensated controlled oscillator arrangement for providing substantially constant modulation level over a wide frequency band includes a linear gain controlled oscillator responsive to a control signal for providing a substantially constant change in gain factor for a constant change in control voltage over a predetermined range of frequencies. An input is provided for receiving an input signal to be modulated. The input is connected to a compensation network which is also coupled to the controlled oscillator and is responsive to the control signal. A linear compensation network provides a compensated output signal having a substantially constant change in signal levels for a constant change in control signal over the predetermined range of frequencies so that the product of a compensated output signal and the gain factor is itself substantially constant over the predetermined range of frequencies.

The features of the invention believed to be novel are set forth with particularity in the appended claims. The invention itself however, both as to organization and method of operation, together with further objects and advantages thereof, may be best understood by reference to the following description taken in conjunction with the accompanying drawings.

BRIEF DESCRIPTION OF THE DRAWINGS

FIG. 6 is a schematic drawing of the audio compensator and voltage controlled oscillator of the present invention.

DETAILED DESCRIPTION OF THE PREFERRED EMBODIMENT

Figure 4:
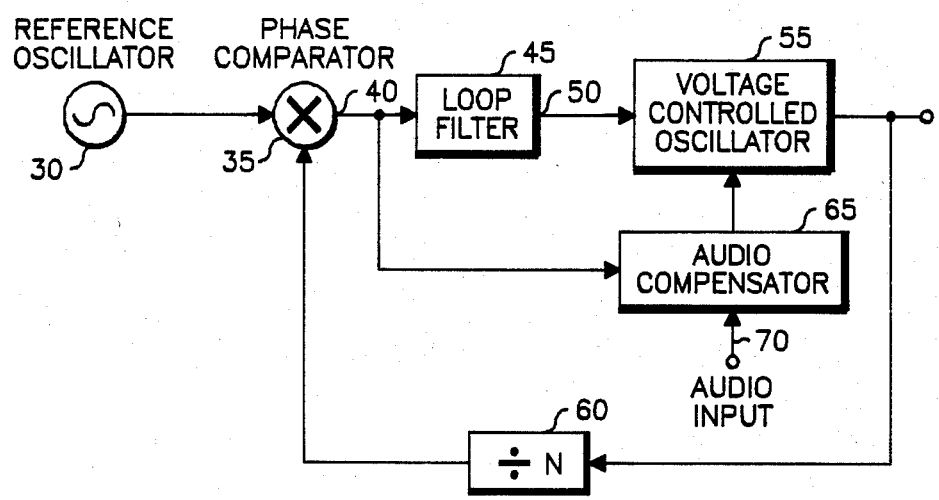
FIG. 4 shows a system block diagram for a synthesizer arrangement utilizing the compensated voltage controlled oscillator of the present invention.

Turning now to FIG. 4, a frequency synthesizer arrangement incorporating the present invention is shown. The principles of frequency synthesis incorporating phase locked loops are well known in the art. Details of the operation of such circuits may be found, for example, in a text book entitled, *Phaselock Techniques*, by Floyd M. Gardner, published in 1979 by John Wiley and Sons, Inc.

The synthesizer arrangement of FIG. 4 includes a reference oscillator 30 for providing a standard reference frequency for the system. The output of reference 30 is coupled to one input of a phase detector or phase comparator 35. The phase detector's output 40 provides a control voltage through a loop filter 45. Loop filter 45 is typically a multiple order low pass filter and serves to smooth the response of the control voltage signal. This filtered control voltage signal appears at an output of loop filter 45. The filtered control voltage appearing at the output 50 of loop filter 45 is applied to the input of a voltage controlled oscillator (VCO) 55, the output of VCO 55 provides the radio frequency signal to be utilized for example in a radio transmitter.

The output of VCO 55 is also fed back to the second input of phase comparator 35. If frequency multiplication is desirable, as it is in most frequency synthesizers, a frequency divider, which may be a programmable frequency divider 60, is inserted between the path of the VCO output and the phase detector input. In a similar manner the output frequency may be divided by inserting a frequency divider between reference oscillator 30 and phase detector 35 (not shown) as is well known in the art.

In the present invention, an audio compensator 65 is included in the circuit arrangement of FIG. 4. Although the term audio compensator is used herein due to the fact that the preferred embodiment synthesizer is used to modulate audio signals, this is not intended to be limiting as the present circuit arrangement may equally well be utilized to modulate digital data, tone codes, etc or combinations thereof.

Audio signals or other signals to be modulated are supplied to an audio input 70 of the audio compensator. The control voltage signal present at the output 40 of phase detector 35 is coupled to a second input of the audio compensator 65. The output of the audio compensator 65 is coupled to the modulation port of VCO 55.

In order to obtain the desired enhanced modulation characteristics of the present invention, the voltage controlled oscillator 55 must be carefully designed to obtain the appropriate characteristics. A circuit arrangement for obtaining the appropriate characteristics will be discussed in detail later, but in order to understand the operation of the present invention an overview is first desirable.

Figure 1:
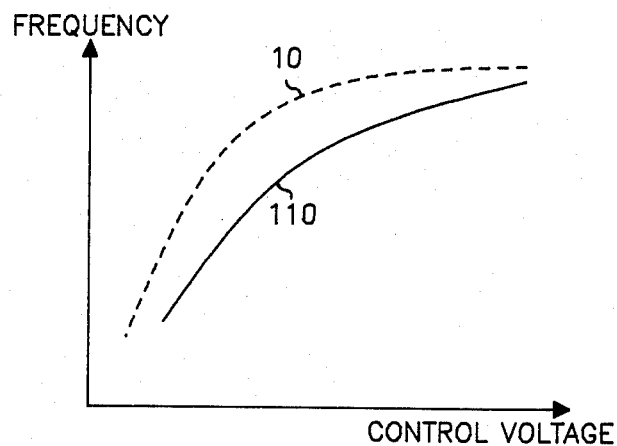
FIG. 1 is a plot of frequency vs. control voltage for the prior art VCO (broken line) as well as the VCO of the present invention (solid line).

Referring back to FIG. 1, solid line curve 110 shows the frequency vs. control voltage characteristic of the linear voltage controlled oscillator 55 of the present invention. The linearization techniques, to be discussed later have been utilized to obtain a more linear frequency vs. control voltage curve than that of the prior art shown in a broken line as curve 10. A considerably more linearized characteristic manifests itself in FIG. 2 as curve 115 for the present VCO. This plot of VCO gain factor $K_0$ as a function of control voltage also shows a wide range of control voltage over which the gain factor may be considered linear. Having obtained a voltage controlled oscillator 55 with linear gain characteristics as a function of control voltage, the audio compensator 65 with substantially complementary characteristics may be designed.

Figure 3:
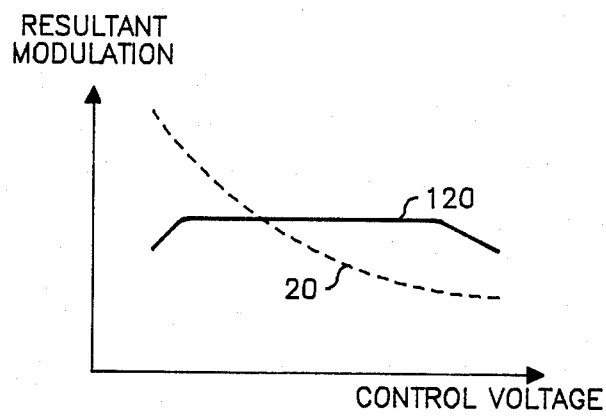
FIG. 3 shows a plot of resultant modulation vs. control voltage for the VCO of the prior art (broken line) as well as the compensated VCO of the present invention (solid line).
Figure 5:
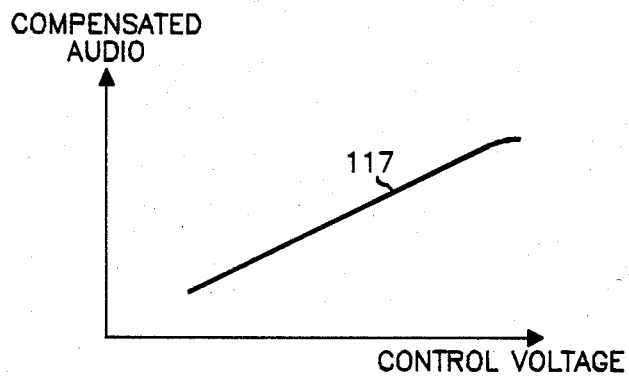
FIG. 5 shows a plot of compensated audio response as a function of control voltage for the audio compensator network of the present invention.

Turning now to FIG. 5, the desired characteristics of audio compensator 65 is shown. For a constant audio input applied to input 70 the compensated audio output increases as control voltage increases and does so in a linear fashion. By appropriate design of the audio compensator, the slope and shape of curve 117 may be adjusted to compliment the slope of curve 115 so that the resultant modulation shown as solid line curve 120 of FIG. 3 is substantially flat having approximately zero slope over a wide range of control voltages. This directly results in flat resultant modulation over a very wide range of frequencies.

Turning now to FIG. 6, a circuit arrangement for practicing the present invention in the range of 95 to 125 Mhz is disclosed. Reference oscillator 30, phase detector 35, loop filter 45 and frequency divider 60 are not shown in detail as these are well known in the art. Voltage controlled oscillator 55 is shown enclosed in broken lines. Its input from the audio compensator 65 is coupled to a resistor 200 the other terminal of which is connected to a negative voltage source. The value of this negative voltage source determines the range of operation of the VCO in the preferred embodiment; for example: −2 volts sets the frequency range between 95 and 110 MHz and −3 volts sets the frequency range from 105 to 125 Mhz.

A capacitor 205 is coupled from the audio compensator input port of VCO 55 to ground. An inductor 210 is coupled from the audio input of the VCO to the anodes of two hyperabrupt varactor diodes 215 and 220. In the preferred embodiment these varactor diodes are hyperabrupt varactor diodes such as the Ferranti ZC834 but many other hyperabrupt varactor diodes will function well in this circuit.

Also coupled to the junction of the anodes of these two varactor diodes is a capacitor 225. The other terminal of capacitor 225 is coupled to the junction of the source of an N-Channel FET 230 and an inductor 235. The other terminal of inductor 235 is coupled to a resistor 240 having the other terminal grounded. A capacitor 242 is coupled from the drain of FET 230 to ground. The drain of FET 230 provides the output of the VCO through capacitor 245. An inductor 250 connects the drain of FET 230 to a positive 7.5 volt DC power supply designated as V+. Capacitor 245 and inductor 250 form a matching network for translating the output impedance to approximately 50 ohms. The gate of transistor 230 is grounded through an inductor 255. The gate of transistor 230 is also coupled to a capacitor 260 which is connected in series to the cathode of varactor diode 215. An inductor 265 is connected from the junction of capacitor 260 and the cathode of varactor diode 215 in series to an inductor 270 which is coupled to the cathode of varactor diode 220. A capacitor 275 is connected from the junction of inductors 265 and 270 to ground. Another capacitor 280 is connected from the junction of the cathode of varactor diode 220 and inductor 270 to ground. The output of loop filter 45 is coupled to the junction of inductors 265 and 270.

Although the topology of VCO 55 initially appears to be somewhat similar to many VCO designs, its gain factor is linearized by applying a feedback signal through capacitor 225 to the junction of diodes 215 and 220. This in combination with utilizing hyperabrupt varactor diodes produces a highly linearized response. The anodes of both varactor diodes 216 and 220 are held at a low voltage by bias resistor 200 which is coupled to a negative DC voltage source. The control voltage is applied to the cathodes of varactor diodes 215 and 220 through inductors 265 and 270 respectively. The control voltage is therefore the same at varactors 215 and 220. This circuit topology has been found to produce linear gain response over a control voltage range of 1.5 to 4.5 volts over the range of 95 to 125 MHz when the component values specified below are utilized.

It will be understood by those skilled in the art that the following component values for the circuit elements of FIG. 6 are presented by way of example and the invention is not to be limited to these values. It will also be clear that circuit layout considerations may necessitate component value adjustments to obtain proper circuit performance.

| COMPONENT NUMBER | COMPONENT VALUES |
| --- | --- |
| 200 | 470K OHMS |
| 205 | 2.0 NanoFarad |
| 210 | 10.0 MicroHenry |
| 215 | Ferranti ZC834 or Similar |
| 220 | Ferranti ZC834 or Similar |
| 225 | 470 PicoFarad |
| 230 | 2N4416 N-Channel FET |
| 235 | 10.0 MicroHenry |
| 240 | 100.0 OHMS |
| 242 | 27 PicoFarad |
| 245 | 10.0 PicoFarad |
| 250 | 100 NanoHenry |
| 255 | 100 NanoHenry |
| 260 | 2.0 NanoFarad |
| 265 | 10.0 MicroHenry |
| 270 | 10.0 MicroHenry |
| 275 | 2.0 NanoFarad |
| 280 | 2.0 NanoFarad |

Voltage controlled oscillator 55 is shown in a Colpitts configuration, but this is not to be limiting as other oscillator configurations may lend themselves to use in the present invention, utilizing varactor diodes 215 and 220 coupled back to back and resonant with a single air wound inductor 255. It should be noted that no tapped inductors are necessary with the present configuration. The FET 230 provides amplification. Feedback is provided from an output of FET 230 through capacitor 225 to return an in phase signal to the anodes of varactor diodes 215 and 220. Since hyperabrupt varactor diodes exhibit the greatest change in capacitance for any given change in voltage of all presently available varactor diodes, a wide tuning range is achieved. Capacitors 260 and 280 are large in value compared to the varactors and serve as DC blocking capacitors used to complete the resonant circuit with inductor 255.

The FET 230 obtains DC bias through inductors 235 and 250 and resistor 240. Resistor 240 sets the bias of FET 230 while inductor 235 decouples radio frequency energy from ground allowing it to be fed back to the resonant circuit through capacitor 225. Inductor 250 in conjunction with capacitor 245 serve as a matching network. Their values may be adjusted to obtain maximum power output into a 50 OHM load over the frequency range of interest.

Reverse bias is provided to the hyperabrupt varactor diodes through RF blocking inductors 210, 265, 270. Capacitor 205 and 275 function to shunt any RF present on the extremes of these inductors to ground. Negative bias is derived from a negative supply coupled through resistor 200 to the anodes of the varactors. This high impedance line is also used as the modulation port of the oscillator. frequency control voltage is derived from the output of the loop filter and is coupled to the oscillator through inductors 265 and 270. With this topography, using hyperabrupt diodes and a simple coil, the desired oscillator gain factor $K_0$ whose slope falls off linearly with increasing control voltage is obtained. It will be evident to those skilled in the art that inductor 255 could be readily replaced by other simple (or complex) reactive elements such as striplines, transmission lines, etc. without departing from the spirit and techniques of the present invention.

FIG. 6 also shows a detail schematic of the preferred embodiment of compensation network 65 of the present invention. The audio input of compensation network 65 is coupled to one terminal of a resistor 300. The other terminal of resistor 300 is coupled to the drain of a P-channel field effect transistor 305 and to one terminal of a resistor 310. The other terminal of resistor 310 is grounded as is the source of transistor 305. Also, coupled to the drain of transistor 305 is a capacitor 315 which serves as a DC blocking capacitor. The output of the compensation network is taken at the second terminal of capacitor 315.

The gate of transistor 305 is connected to the anode of a diode 320. The cathode of diode 320 is connected through a resistor 325 to ground. A resistor 330 is connected to the junction of diode 320 and the gate of transistor 305 at one terminal while its other terminal provides the control voltage input to the audio compensator.

Compensation network 65 operates as an active voltage divider with transistor 305 being biased in the variable resistance region. Transistor 305 therefore forms an active resistor which is in parallel with resistor 310. The value of resistor 310 determines largely the shape of solid line curve 117 of FIG. 5 so that the value of resistor 310 may be used to adjust the compensation network to obtain a flat resultant compensation.

The amount of voltage division which takes place is a function of the value of resistor 325 and bias voltage applied to the base of transistor 305 by the bias network composed of resistors 325, 330 and diode 320. The control voltage applied to resistor 330 and the value of resistor 325 therefore actively adjusts this divider ratio as necessary to maintain constant modulation over the frequency range of interest. Diode 320 is utilized to obtain temperature compensation for the audio compensator and is effective from approximately −40° to +90° Celcius.

Resistor 325 may be adjusted to change the amount of audio compensation obtained at the high end of the frequency band. A low value of resistance provides a small amount of compensation and a higher resistance value provides a higher degree of compensation in this region.

The component values tabulated below provide an appropriate circuit arrangement for use in conjunction with the VCO previously described. The circuit can accomodate up to approximately 3 volts peak to peak applied at the audio input at frequencies up to approximately 100 Khz. Althouh the values shown below may be used to realize the compensation network of the present invention, the invention is not to be limited to those particular circuit values shown.

| COMPONENT NUMBER | COMPONENT VALUE |
| --- | --- |
| 300 | 250K OHMS |
| 305 | 2N5640 P-Channel FET |
| 310 | 700 OHMS |
| 315 | 10.0 MicroFarad |
| 320 | 1N914 Diode or Similar |
| 325 | 250-700K OHMS |
| 330 | 470K OHMS |

Because of the linear reduction in $K_0$ as oscillator frequency increases it becomes necessary to adjust the amplitude of the incoming audio signal to the oscillator circuit so that frequency modulation is constant over the oscillator tuning range. This is accomplished by utilizing the variable resistance properties of FET 305. Audio of constant amplitude is fed to resistor divider network comprised of resistor 300 in seris with the parallel combination of resistor 310 in parallel with $R_{DS}$ of FET 305. Resistor values are chosen for 40 dB of attenuation in order to keep less than 10 mV of AC voltage swing on the Drain-Source junction so that the nonlinearities of this junction are kept to a minimum, thereby providing less than 0.5% distortion. This is preferred because the oscillator is very sensitive, having a $K_0$ on the order of 7 MHz/V, and any small signal sent to the oscillator is highly amplified to obtain the final modulation level. The audio is coupled to the anodes of varactor diodes 215 and 220 through capacitor 315 which may be chosen as large as possible to obtain the best low frequency response suitable for low frequency digital transmissions if required.

The control voltage fed to the oscillator is also used to control the FET 305 in order to effect a change in FET resistance. This voltage is taken before the loop filter in order not to compromise loop filter dynamics and is also fed through a voltage division network made up of resistors 330 and 325 and diode 320 to the gate of the FET. As the control voltage and oscillator frequency increase, $K_0$ drops off linearly. By this same increase in control voltage, gate voltage also increases through the divider network causing the FET Drain-Source resistance to increase. This provides less attenuation through the audio divider network. By proper selection of resistor 310 and the drain source resistance characteristics of FET 305 the $K_0$ decrease may be complemented by this decrease of attenuation in linear fashion, to provide constant modulation over the oscillator frequency range.

The value of resistor 325 may be adjusted while monitoring deviation at the upper and lower oscillator extremes to adjust the level of compensation to be exactly the same at these two extremes. Once accomplished, the modulation is held to within 1% between the extremes and hence, linearized. Diode 320 is used as thermal compensation for FET 305 so that linearity is also achieved through a temperature range of approximately −40° C. to +90° C.

Figure 2:
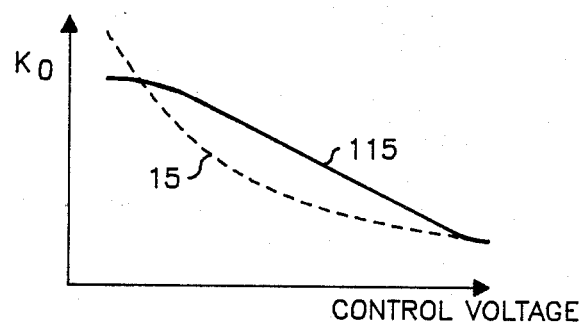
FIG. 2 is a plot of VCO gain factor $K_0$ expressed in Mhz per volt vs. control voltage for the voltage controlled oscillator of the present invention (solid line) as well as the prior art (broken line).

In summary, it has been shown that by providing a voltage controlled oscillator having linear gain factor as a function of control voltage such as curve 115 shown in FIG. 2, a linear compensation network having similar but opposite characteristics such as curve 117 shown in FIG. 5 may be used to effect a very broad band flattening of the modulation as shown in FIG. 3 as curve 120.

Thus it is apparent that in accordance with the present invention an apparatus that fully satisfies the objectives, aims and advantages is set forth above. While invention has been described in conjunction with a specific embodiment it is evident that many alternatives, modifications and variations will become apparent to those skilled in the art upon consideration of the foregoing description. Accordingly, it is intended that the present invention embrace all such alternatives, modifications and variations as fall within the spirit and broad scope of the appended claims.

What is claimed is:

1. A compensated voltage controlled oscillator arrangement for providing a substantially constant modulation level over a wide frequency band, comprising:
   a linear gain voltage controlled oscillator (VCO) having a control input and responsive to a control voltage for providing a substantially constant change in VCO gain factor $K_0$ for a fixed change in said control voltage over a predetermined range of frequencies;
   input means for receiving an input modulating signal; and
   linear compensation means, coupled to said input means and said control input of said voltage controlled oscillator and responsive to said control voltage for providing a compensated output signal to said contol input of said VCO having a substantially constant change in signal level for a fixed change in said control voltage over said predetermined range of frequencies, so that the product of said compensated output signal and said VCO gain factor $K_0$ is substantially constant over said predetermined range of frequencies.

2. The compensated voltage controlled oscillator arrangement of claim 1, wherein said linear voltage controlled oscillator includes:
   a feedback circuit including an inductor, a first hyperabrupt varactor diode and a second hyperabrupt varactor diode operatively coupled together to form an electrically resonant network;
   bias means for applying reverse bias to said hyperabrupt varactor diodes;
   an amplifier having an input operatively coupled to said feedback circuit and an output operatively coupled to said first and second varactor diodes.

3. The compensated voltage controlled oscillator arrangement of claim 1, wherein said linear voltage controlled oscillator includes:
   an amplifier having an input port and an output port;
   a feedback circuit including an inductor, a first hyperabrupt varactor diode having an anode and a cathode, and a second hyperabrupt varactor diode having an anode and a cathode, the anodes of said first and second hyperabrupt varactor diodes coupled together to form a circuit node, and said inductor operatively coupled to the cathodes of said first and second hyperabrupt varactor diodes to form an electrically resonant circuit, said input port operatively coupled to said first cathode and said output port operatively coupled to said circuit node; and bias means for supplying reverse bias to said first and second hyperabrupt varactor diodes.

4. The compensated voltage controlled oscillator arrangement of claim 3, wherein said inductor is an air coil type inductor.

5. The compensated voltage controlled oscillator arrangement of claim 3, further including means for applying said compensated output signal to said circuit node.

6. The compensated voltage controlled oscillator arrangement of claim 3, wherein said amplifier includes a field effect transistor amplifier.

7. The compensated voltage controlled oscillator arrangement of claim 1, wherein said linear compensation means includes:

an active voltage divider circuit comprising a field effect transistor biased in the variable resistance region having its drain to source resistance coupled in series with a resistor; and control means coupled to the gate of said field effect transistor responsive to said control voltage for varying said drain to source resistance in response to changes in said control voltage so that the voltage division ratio of said voltage divider changes in response to changes in said control voltage.

8. The compensated voltage controlled oscillator arrangement of claim 7, wherein said control means includes temperature compensating means for compensating for changes in the characteristics of said field effect transistor due to variations in the temperature of said field effect transistor.

9. The compensated voltage controlled oscillator arrangement of claim 8, wherein said temperature compensating means includes, the series combination of a resistor and a forward biased junction diode connected between the gate and the source of said field effect transistor.

* * * * *